United States Patent
Gaidis et al.

(10) Patent No.: US 10,003,014 B2
(45) Date of Patent: Jun. 19, 2018

(54) METHOD OF FORMING AN ON-PITCH SELF-ALIGNED HARD MASK FOR CONTACT TO A TUNNEL JUNCTION USING ION BEAM ETCHING

(71) Applicants: INTERNATIONAL BUSINESS MACHINES CORPORATION, Armonk, NY (US); CROCUS TECHNOLOGY, Santa Clara, CA (US)

(72) Inventors: Michael C. Gaidis, San Jose, CA (US); Erwan Gapihan, White Plains, NY (US); Rohit Kilaru, New York, NY (US); Eugene J. O'Sullivan, Nyack, NY (US)

(73) Assignees: INTERNATIONAL BUSINESS MACHINES CORPORATION, Armonk, NY (US); CROCUS TECHNOLOGY, Santa Clara, CA (US)

( * ) Notice: Subject to any disclaimer, the term of this patent is extended or adjusted under 35 U.S.C. 154(b) by 171 days.

(21) Appl. No.: 14/310,844

(22) Filed: Jun. 20, 2014

(65) Prior Publication Data
US 2015/0372225 A1    Dec. 24, 2015

(51) Int. Cl.
*G11C 11/16*     (2006.01)
*H01L 43/08*     (2006.01)
(Continued)

(52) U.S. Cl.
CPC ............ *H01L 43/08* (2013.01); *G11C 11/161* (2013.01); *H01L 21/31105* (2013.01);
(Continued)

(58) Field of Classification Search
CPC ......... H01L 43/08; H01L 43/10; H01L 43/12; H01L 43/02; H01L 21/02351;
(Continued)

(56) References Cited

U.S. PATENT DOCUMENTS 3,846,822 A * 11/1974 Riley .................. H01L 21/00
257/340
5,386,121 A *  1/1995 Barbee .................. C23C 16/52
250/341.8
(Continued)

OTHER PUBLICATIONS

Chun, S., et al., "Negative Electron-Beam Resist Hard Mask Ion Beam Etching Process for the Fabrication of Nanoscale Magnetic Tunnel Junctions" Journal of Vacuum Science & Technology B: Microelectronics and Nanometer Structures. Nov. 2012. vol. 30, Issue 6. 5 Pages.
(Continued)

*Primary Examiner* — Sophia Nguyen
(74) *Attorney, Agent, or Firm* — Tutunjian & Bitetto, P.C.; Vazken Alexanian

(57) ABSTRACT

A method of forming a memory device that in one embodiment may include forming a magnetic tunnel junction on a first electrode using an electrically conductive mask and subtractive etch method. Following formation of the magnetic tunnel junction, at least one dielectric layer is deposited to encapsulate the magnetic tunnel junction. Ion beam etching/Ion beam milling may then remove the portion of the at least one dielectric layer that is present on the electrically conductive mask, wherein a remaining portion of the at least one dielectric layer is present over the first electrode. A second electrode may then be formed in contact with the electrically conductive mask.

7 Claims, 5 Drawing Sheets

(51) Int. Cl.
    *H01L 43/12*     (2006.01)
    *H01L 21/311*     (2006.01)
    *H01L 43/02*     (2006.01)
    *H01L 43/10*     (2006.01)

(52) U.S. Cl.
    CPC .............. *H01L 43/02* (2013.01); *H01L 43/10* (2013.01); *H01L 43/12* (2013.01); *B81C 2201/0132* (2013.01); *B81C 2201/0142* (2013.01); *B81C 2201/0143* (2013.01)

(58) Field of Classification Search
    CPC ......... H01L 2201/0132; H01L 21/0143; H01L 21/014; B81C 2201/0132; B81C 2201/0143; B81C 2201/014; G11C 11/161; G01R 33/098; G01R 15/205; G01R 15/207; G11B 5/3909; H03B 15/006
See application file for complete search history.

(56) References Cited

U.S. PATENT DOCUMENTS

| | | | | |
|---|---|---|---|---|
| 5,891,242 | A * | 4/1999 | Pesklak | C30B 29/06 117/2 |
| 6,004,907 | A * | 12/1999 | Suh | H01L 39/2496 505/190 |
| 6,541,789 | B1 * | 4/2003 | Sato | H01L 39/225 257/31 |
| 6,780,652 | B2 * | 8/2004 | Lee | H01L 27/222 257/E21.665 |
| 6,965,138 | B2 | 11/2005 | Nakajima et al. | |
| 6,984,530 | B2 * | 1/2006 | Lee | H01L 43/12 257/E27.005 |
| 7,008,871 | B2 * | 3/2006 | Andricacos | H01L 21/2885 257/758 |
| 7,045,368 | B2 | 5/2006 | Hong et al. | |
| 7,550,044 | B2 | 6/2009 | Gaidis et al. | |
| 7,745,324 | B1 * | 6/2010 | Yang | H01L 21/02068 257/E21.304 |
| 7,955,870 | B2 | 6/2011 | Ditizio | |
| 7,989,224 | B2 * | 8/2011 | Gaidis | G11C 11/16 257/295 |
| 7,993,535 | B2 | 8/2011 | Jiang et al. | |
| 8,133,745 | B2 * | 3/2012 | Zhong | B82Y 10/00 257/295 |
| 8,574,928 | B2 | 11/2013 | Satoh et al. | |
| 8,642,358 | B2 * | 2/2014 | Lee | H01L 43/12 257/295 |
| 8,835,889 | B1 | 9/2014 | Abraham et al. | |
| 8,975,089 | B1 * | 3/2015 | Jung | H01L 43/12 257/295 |
| 9,159,907 | B2 * | 10/2015 | Tang | H01L 43/08 |
| 9,472,749 | B2 * | 10/2016 | Annunziata | H01L 43/08 |
| 9,490,164 | B1 * | 11/2016 | Engelmann | H01L 21/76829 |
| 9,502,640 | B1 | 11/2016 | Annunziata et al. | |
| 2001/0025826 | A1 * | 10/2001 | Pierson | H01L 21/30621 216/55 |
| 2002/0044394 | A1 * | 4/2002 | Hasegawa | B82Y 10/00 360/324.1 |
| 2002/0127763 | A1 * | 9/2002 | Arafa | H01L 21/823468 438/76 |
| 2002/0145835 | A1 * | 10/2002 | Suzuki | B82Y 10/00 360/324.2 |
| 2003/0015494 | A1 * | 1/2003 | Jayashankar | G03F 7/428 216/63 |
| 2003/0186090 | A1 * | 10/2003 | Onoe | B82Y 10/00 428/701 |
| 2004/0020894 | A1 * | 2/2004 | Williams | B82Y 10/00 216/14 |
| 2004/0121531 | A1 * | 6/2004 | Wieczorek | H01L 21/26506 438/197 |
| 2004/0140477 | A1 * | 7/2004 | Tani | H01S 5/22 257/102 |
| 2004/0266154 | A1 * | 12/2004 | Lim | H01L 21/28247 438/592 |
| 2005/0020011 | A1 * | 1/2005 | Nakajima | B82Y 10/00 438/257 |
| 2005/0111148 | A1 * | 5/2005 | Li | B82Y 10/00 360/324.12 |
| 2005/0176182 | A1 * | 8/2005 | Me | H01L 27/12 438/149 |
| 2005/0218445 | A1 * | 10/2005 | Van Duuren | H01L 29/7881 257/316 |
| 2005/0231856 | A1 * | 10/2005 | Kao | B82Y 10/00 360/324.11 |
| 2006/0019504 | A1 * | 1/2006 | Taussig | B82Y 10/00 438/142 |
| 2006/0148234 | A1 * | 7/2006 | Chen | H01L 43/12 438/618 |
| 2007/0023806 | A1 * | 2/2007 | Gaidis | B82Y 10/00 257/295 |
| 2007/0173002 | A1 * | 7/2007 | Hall | H01L 21/28114 438/184 |
| 2007/0281446 | A1 * | 12/2007 | Winstead | H01L 21/84 438/478 |
| 2008/0061379 | A1 * | 3/2008 | Chen | H01L 29/6656 257/382 |
| 2008/0061477 | A1 * | 3/2008 | Capizzo | H01J 9/025 264/402 |
| 2008/0160640 | A1 * | 7/2008 | Butcher | H01L 43/12 438/3 |
| 2008/0211055 | A1 * | 9/2008 | Assefa | H01L 43/12 257/506 |
| 2008/0232001 | A1 * | 9/2008 | Bonhote | G11B 5/11 360/319 |
| 2009/0130779 | A1 * | 5/2009 | Li | H01L 43/12 438/3 |
| 2009/0141543 | A1 | 6/2009 | Ho et al. | |
| 2009/0159563 | A1 * | 6/2009 | Jung | H01L 43/12 216/22 |
| 2009/0208778 | A1 * | 8/2009 | Horiguchi | B82Y 10/00 428/832 |
| 2009/0209050 | A1 * | 8/2009 | Wang | H01L 27/228 438/3 |
| 2010/0155591 | A1 * | 6/2010 | Matsuo | H01J 49/142 250/282 |
| 2010/0200900 | A1 * | 8/2010 | Iwayama | B82Y 25/00 257/295 |
| 2010/0237410 | A1 * | 9/2010 | Zhu | H01L 29/1045 257/335 |
| 2011/0006033 | A1 * | 1/2011 | Peng | B82Y 10/00 216/22 |
| 2011/0049655 | A1 * | 3/2011 | Assefa | H01L 27/222 257/421 |
| 2011/0049656 | A1 | 3/2011 | Li et al. | |
| 2011/0089511 | A1 | 4/2011 | Keshtbod et al. | |
| 2011/0121417 | A1 * | 5/2011 | Li | H01L 43/12 257/421 |
| 2011/0169112 | A1 * | 7/2011 | Chen | B82Y 10/00 257/421 |
| 2011/0194341 | A1 * | 8/2011 | Gaidis | H01L 27/24 365/171 |
| 2011/0235217 | A1 * | 9/2011 | Chen | H01L 43/12 360/324.2 |
| 2012/0015196 | A1 * | 1/2012 | Wang | C03C 15/00 428/428 |
| 2012/0028373 | A1 | 2/2012 | Belen et al. | |
| 2012/0139080 | A1 * | 6/2012 | Wang | H01L 21/743 257/506 |
| 2012/0151997 | A1 * | 6/2012 | Kochupurackal | G01N 27/4141 73/31.06 |
| 2012/0157319 | A1 * | 6/2012 | Tsukamoto | G01R 33/0354 505/162 |
| 2012/0205764 | A1 * | 8/2012 | Chen | G11C 11/16 257/422 |
| 2012/0223048 | A1 * | 9/2012 | Paranjpe | C23C 14/042 216/22 |
| 2012/0276414 | A1 * | 11/2012 | Maeda | G11B 5/65 428/828 |

(56) References Cited

U.S. PATENT DOCUMENTS

| | | | |
|---|---|---|---|
| 2012/0280250 A1* | 11/2012 | Basker | H01L 21/823821 257/77 |
| 2012/0282711 A1* | 11/2012 | Abedifard | H01L 43/12 438/3 |
| 2013/0026576 A1* | 1/2013 | Stockinger | H01L 27/0255 257/355 |
| 2013/0026585 A1* | 1/2013 | Sung | H01L 43/08 257/421 |
| 2013/0029431 A1* | 1/2013 | Takahashi | H01L 43/12 438/3 |
| 2013/0052752 A1 | 2/2013 | Satoh et al. | |
| 2013/0069186 A1 | 3/2013 | Toko et al. | |
| 2013/0075838 A1* | 3/2013 | Chen | H01L 43/08 257/421 |
| 2013/0075840 A1* | 3/2013 | Satoh | H01L 43/12 257/421 |
| 2013/0093020 A1* | 4/2013 | Zhu | H01L 21/84 257/347 |
| 2013/0146957 A1* | 6/2013 | Cheng | H01L 27/1203 257/301 |
| 2013/0267042 A1* | 10/2013 | Satoh | H01L 27/222 438/3 |
| 2013/0316536 A1* | 11/2013 | Seto | H01L 21/2633 438/689 |
| 2014/0087483 A1* | 3/2014 | Ohsawa | H01J 37/08 438/3 |
| 2014/0138347 A1* | 5/2014 | Toyosato | H01L 43/12 216/22 |
| 2014/0170776 A1* | 6/2014 | Satoh | H01L 43/12 438/3 |
| 2014/0177326 A1* | 6/2014 | Doyle | H01L 43/12 365/158 |
| 2014/0198564 A1* | 7/2014 | Guo | G11C 11/161 365/158 |
| 2014/0217487 A1* | 8/2014 | Guo | H01L 43/12 257/295 |
| 2014/0227801 A1* | 8/2014 | Hsu | H01L 43/12 438/3 |
| 2014/0246741 A1* | 9/2014 | Guo | H01L 43/12 257/421 |
| 2014/0295584 A1* | 10/2014 | Kane | H01L 22/12 438/18 |
| 2014/0327096 A1* | 11/2014 | Guo | H01L 43/10 257/421 |
| 2014/0363678 A1* | 12/2014 | Kirkpatrick | C23C 14/5833 428/408 |
| 2015/0014800 A1 | 1/2015 | Satoh et al. | |
| 2015/0021724 A1* | 1/2015 | Mani | H01L 43/08 257/421 |
| 2015/0035083 A1* | 2/2015 | Han | H01L 29/665 257/410 |
| 2015/0041192 A1* | 2/2015 | Han | H05K 3/108 174/257 |
| 2015/0171314 A1* | 6/2015 | Li | G11C 11/161 257/421 |
| 2015/0171822 A1* | 6/2015 | Marksteiner | H01L 41/0805 333/187 |
| 2015/0188033 A1* | 7/2015 | Lamborn | H01L 43/02 257/421 |
| 2015/0206949 A1* | 7/2015 | Zhao | H01L 29/495 257/410 |
| 2015/0263267 A1* | 9/2015 | Kanaya | H01L 43/08 257/421 |
| 2015/0276651 A1* | 10/2015 | Petisce | G01N 27/3272 204/403.1 |
| 2015/0311253 A1* | 10/2015 | Choi | H01L 27/228 257/252 |
| 2015/0318377 A1* | 11/2015 | Cheng | H01L 29/0638 257/349 |
| 2015/0325622 A1* | 11/2015 | Zhang | H01L 27/222 257/421 |
| 2015/0364358 A1* | 12/2015 | Tsai | H01L 21/762 438/400 |
| 2015/0372225 A1* | 12/2015 | Gaidis | H01L 43/08 257/421 |
| 2016/0020384 A1* | 1/2016 | Jeong | H01L 43/08 257/421 |
| 2016/0064652 A1* | 3/2016 | Guo | H01L 43/12 257/421 |
| 2016/0181509 A1* | 6/2016 | Shin | H01L 43/02 438/3 |
| 2016/0276579 A1* | 9/2016 | Gaidis | H01L 43/08 |
| 2017/0125668 A1* | 5/2017 | Paranjpe | H01L 43/12 |

OTHER PUBLICATIONS

Kim, E., et al., "Evolution of Etch Profile of Magnetic Tunnel Junction Stacks Etched in a CH3OH/Ar Plasma" Journal of the Electrochemical Society. Dec. 2011. vol. 159, Issue 3. 5 Pages.

Takahashi, S., et al., "Ion-Beam-Etched Profile Control of MTJ Cells for Improving the Switching Characteristics of High-Density MRAM" Oct. 2006. IEEE Transactions on Magnetics. vol. 42, No. 10. 3 Pages.

U.S. Office Action issued in U.S. Appl. No. 15/170,359 dated Apr. 19, 2017, pp. 1-13.

U.S. Office Action issued in U.S. Appl. No. 15/170,359 dated Aug. 10, 2017, pp. 1-14.

U.S. Final Office Action issued in U.S. Appl. No. 15/170,359, dated Feb. 13, 2018, pp. 1-15.

\* cited by examiner

METHOD OF FORMING AN ON-PITCH SELF-ALIGNED HARD MASK FOR CONTACT TO A TUNNEL JUNCTION USING ION BEAM ETCHING

BACKGROUND

Technical Field

The present disclosure relates to electrical devices, such as electrical devices including magnetic tunnel junctions.

Description of the Related Art

The dimensions of semiconductor devices and memory devices have been steadily shrinking over the last thirty years or so, as scaling to smaller dimensions leads to continuing device performance improvements. Memory devices, such as magnetic memory devices, e.g., spin torque transfer random access memory, have typically been formed using etch patterning methods, such as reactive ion etching. As memory devices continued to scale to smaller and smaller dimensions, the precision of etch patterning methods, such as reactive ion etching, can limit their suitability for forming structural features of the increasingly scaled memory device.

SUMMARY

In one aspect, a method of forming a memory device is provided that includes forming a magnetic tunnel junction stack on a first electrode using an electrically conductive mask and subtractive etch method. Following formation of the magnetic tunnel junction, at least one dielectric layer is deposited to encapsulate the magnetic tunnel junction stack. Ion beam etching may then remove the portion of the at least one dielectric layer that is present on the electrically conductive mask, wherein a remaining portion of the at least one dielectric layer is present over the first electrode. A second electrode may then be formed in contact with the electrically conductive mask.

In another embodiment, a method of forming a memory device is provided that includes forming a layered stack on a first electrode that is present on a substrate, the layered stack including a magnetic tunnel junction on the first electrode, and an electrically conductive mask on the magnetic tunnel junction. Following formation of the layered stack, at least one dielectric layer is blanket deposited on the layered stack and exposed portions of the first electrode and the portion of the substrate that are adjacent to the layered stack. Ion beam etching may then remove a portion of the at least one dielectric layer to expose the electrically conductive mask. A remaining portion of the at least one dielectric layer is present on sidewalls of the magnetic tunnel junction of the layered stack, the exposed portions of the first electrode and the substrate adjacent to the layered stack. A second electrode may then be formed in contact with the electrically conductive mask.

In another aspect, a memory device is provided that includes a first electrode present on a substrate, and a magnetic tunnel junction stack that is present on the first electrode. An electrically conductive mask is present on an upper surface of the magnetic tunnel junction. At least one dielectric layer is present on exposed portions of the substrate, and exposed portions of the first electrode that are present adjacent to the magnetic tunnel junction stack. The at least one dielectric layer is also present on a sidewall of the magnetic tunnel junction, and at least a portion of a sidewall of the electrically conductive mask. A dimension extending from an upper surface of the magnetic tunnel junction to the first electrode is greater than a height of the at least one dielectric layer that is present on the sidewall of the electrically conductive mask. A second electrode is present on the electrically conductive mask.

BRIEF DESCRIPTION OF DRAWINGS

The following detailed description, given by way of example and not intended to limit the disclosure solely thereto, will best be appreciated in conjunction with the accompanying drawings, wherein like reference numerals denote like elements and parts, in which.

DETAILED DESCRIPTION OF THE PREFERRED EMBODIMENTS

Figure 1:
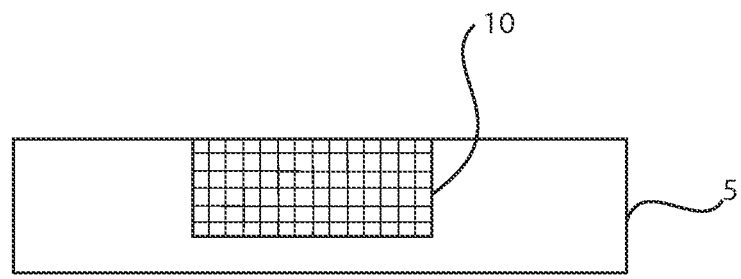
FIG. 1 is a side cross-sectional view depicting forming a first electrode on a substrate, in accordance with one embodiment of the present disclosure.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. For purposes of the description hereinafter, the terms "upper", "lower", "right", "left", "vertical", "horizontal", "top", "bottom", and derivatives thereof shall relate to the embodiments of the disclosure, as it is oriented in the drawing figures. The terms "positioned on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

In some embodiments, the present disclosure is related to preparing contacts to semiconductor devices, such as memory devices. As used herein, the term "memory device" means a structure in which the electrical state or magnetic state can be altered and then retained in the altered state, in this way a bit of information can be stored. In some instances, the methods and structures that are disclosed herein are applicable for forming contacts, i.e., electrodes, to the electrically conductive mask of a magnetic tunnel junction (MJT) in a memory device. In the following description, the memory device being formed is a spin torque transfer random access memory (STTRAM). The spin torque transfer random access memory (STTRAM) device is a magnetic random access memory (MRAM) device, in which the data is not stored as electric charge or current flows, but by magnetic storage elements.

In an MRAM device, the elements are formed from two ferromagnetic plates, each of which can hold a magnetic field, separated by a thin insulating layer. In some embodiments, one of the two plates is a permanent magnet set to a particular polarity, and the other plate's field can be changed to match that of an external field to store memory. This configuration is known as a spin valve and is the simplest structure for an MRAM bit. A memory device is built from a grid of such "cells". The simplest method of reading is accomplished by measuring the electrical resistance of the cell. A particular cell is (typically) selected by powering an associated transistor that switches current from a supply line through the cell to ground. Due to the magnetic tunnel effect, the electrical resistance of the cell changes due to the orientation of the fields in the two plates. By measuring the resulting current, the resistance inside any particular cell can be determined, and from this the polarity of the writable plate. Typically, if the two plates have the same polarity this is considered to mean "1", while if the two plates are of opposite polarity the resistance will be higher and this means "0". Data is written to the cells using a variety of means. In one embodiment, each cell may be positioned between a pair of write lines arranged at right angles to each other, above and below the cell, When current is passed through them, an induced magnetic field is created at the junction, which the writable plate picks up.

In a spin transfer torque (STT), or spin transfer switching, MRAM device (STTRAM), spin-aligned ("polarized") electrons are employed to directly torque the domains. Specifically, if the electrons flowing into a layer have to change their spin, this will develop a torque that will be transferred to the nearby layer. In some embodiments, this lowers the amount of current needed to write the cells, making it about the same as the read process.

Typically, spin torque transfer random access memory (STTRAM) devices are formed using etch patterning methods, such as reactive ion etching (RIE). As spin torque transfer random access memory (STTRAM) devices are scaled to smaller and smaller dimensions, the precision of etch patterning methods, such as reactive ion etching (RIE), can limit their suitability for forming structural features of the increasingly scaled device. In some embodiments, the methods and structures that are disclosed herein employ ion beam milling/ion beam etch to remove dielectric materials to expose the electrically conductive materials, e.g., electrically conductive mask, that are present on the upper surface of the magnetic tunnel junction stack prior to forming electrical contacts to the layered stack. As used herein, "ion beam milling/ion beam etch" denotes a material removal process that employs ions within a plasma formed by an electric discharge that are accelerated by an electric field towards and bombard the material to be removed. In some examples, the ions within the plasma may be argon ions that are focused into a highly collimated beam. In some embodiments, by using ion beam milling methods as a material removal process in forming the contacts to memory devices a higher degree of precision is provided that is not available using etching process, such as wet and dry chemical etching processes.

Although the following description describes the formation of an STTRAM device, it is noted that this is only one example of a memory device that consistent with the methods and structures that are disclosed herein. For example, the methods and structures that are disclosed herein are equally applicable to any type of memory device where one bit is associated to one complementary metal oxide semiconductor (CMOS) device, such as, for example: ferroelectric random access (FRAM), magnetic random access memory (MRAM), phase change random access memory (PCRAM), carbon nanotube random access memory (NRAM), resistive random access memory (RRAM), copper bridge random access memory (CBRAM), polymer RAM, and combinations thereof. The methods and structures of the present disclosure are now discussed with more detail referring to FIGS. 1-6.

FIG. 1 depicts one embodiment of forming a base contact 10 (hereafter referred to as first electrode) that is positioned on a substrate 5. In the embodiment that is depicted in FIG. 1, the first electrode 10 is present in a trench that is formed in the substrate 5. In some embodiments, the substrate 5 may be composed of a dielectric material, such as an oxide, nitride or oxynitride material. For example, when the dielectric material that provides the substrate 5 is an oxide, the substrate 5 may be composed of silicon oxide ($SiO_2$). In another embodiment, when the dielectric material that provides the substrate 5 is a nitride, the substrate 5 may be composed of silicon nitride. In other examples, the dielectric material that provides the substrate 5 is selected from the group consisting of SiC, SiCO, SiCOH, and SiCH compounds, the above-mentioned silicon containing materials with some or all of the Si replaced by Ge, carbon doped oxides, inorganic oxides, inorganic polymers, hybrid polymers, organic polymers such as polyamides or SiLK™, other carbon containing materials, organo-inorganic materials such as spin-on glasses and silsesquioxane-based materials, and diamond-like carbon (DLC), also known as amorphous hydrogenated carbon, α-C:H). In some embodiments, a semiconductor material may be used for the substrate 5 instead of a dielectric material, or the substrate 5 may include a combination of semiconductor and dielectric materials.

In some embodiments, the trench that is present in the substrate 5 that houses the first electrode 10 may be formed using pattern and etch processing. For example, the trench may be formed in the substrate 5 by forming a photoresist mask on the upper surface of the substrate 5. Thereafter, an etch process, such as reactive ion etch (RIE), may be applied to etch the exposed portions of the substrate 5 that are not protected by the photoresist mask. The etch process may be an etch process that removes the material of the substrate 5 selectively to the photoresist mask. The term "selective" as used herein to describe a material removal process denotes that the rate of material removal for a first material is greater than the rate of removal for at least another material of the structure to which the material removal process is being applied. For example, in one embodiment, a selective etch may include an etch chemistry that removes a first material selectively to a second material by a ratio of 100:1 or greater.

Still referring to FIG. 1, the first electrode 10 may be formed in the trench that is formed in the substrate 5. The first electrode 10 may be composed of any electrically conductive material. A "electrode" as used to describe a component of the memory devices represents one of the two electrically conductive materials of the memory device that are on opposing sides and separated by the magnetic tunnel junction (MJT). "Electrically conductive" as used through the present disclosure means a material typically having a room temperature conductivity of greater than $10^{-8}$ $(\Omega\text{-m})^{-1}$. In some embodiments, the first electrode 10 is composed of a metal material, such as copper, aluminum, tantalum, tungsten, titanium, platinum, silver, nickel or gold. In the embodiments, in which the first electrode 10 is composed of a metal, the first electrode 10 may be deposited using a physical vapor deposition (PVD) process. Examples of physical vapor deposition (PVD) processes that are suitable for forming the first electrode 10 include plating, sputtering, electroplating, electrophoretic deposition, and combinations thereof. In other embodiments, the metal may be deposited using a chemical vapor deposition process, such as plasma enhanced chemical vapor deposition (PECVD). In some embodiments, the material of the first electrode 10 may be an electrically conductive semiconductor, such as n-type doped polysilicon.

In some embodiments, following deposition of the material for the first electrode 10 in the trench of the substrate 5, a planarization process, such as chemical mechanical planarization (CMP) may be used to planarize the upper surface of the electrically conductive material that is present in the trench. In some embodiments, the planarization process may continue until the upper surface of the electrically conductive material that provides the first electrode 10 within the trench is coplanar with the upper surface of the portion of the substrate 5 that is not etched.

Figure 2:
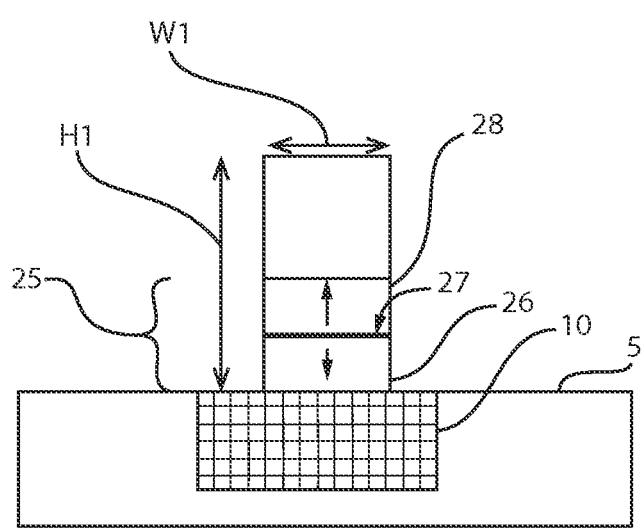
FIG. 2 is a side cross-sectional view depicting forming a layered stack of a magnetic tunnel junction on the first electrode, and an electrically conductive mask on the magnetic tunnel junction, in accordance with one embodiment of the present disclosure.

FIG. 2 depicts forming a layered stack of a magnetic tunnel junction 25 on the first electrode 5, and an electrically conductive mask 20 on the magnetic tunnel junction 25. The magnetic tunnel junction 25 includes a first and second ferromagnetic plate 26, 28 separated by an insulating layer 27. The first ferromagnetic plate 26 that is present on the first electrode 10 may be referred to as the storage layer of the magnetic tunnel junction 25. The first ferromagnetic plate 26 that is present on the first electrode 10 may be one or more of nickel iron (NiFe), cobalt iron (CoFe), iridium-manganese (IrMn), platinum manganese (PtMn), ruthenium (Ru), cobalt iron boron (CoFeB), chromium molybdenum (CrMo), tantalum (Ta), tantalum nitride (TaN), and combinations thereof. The first ferromagnetic plate 26 may be composed of a single layer or multiple layers. It is noted that the above noted materials for the first ferromagnetic plate 26 are selected for illustrative purposes only and are not intended to be limiting. Other ferromagnetic materials are also suitable for the first ferromagnetic plate 26. The thickness for the first ferromagnetic plate 26 may range from 1 nm to 20 nm. In another embodiment, the thickness of the first ferromagnetic plate 26 may range from 1 nm to 10 nm.

The insulating layer 27 that is present between the first ferromagnetic plate 26 and the second ferromagnetic plate 28 may be referred to as a barrier layer. The insulating layer 27 for the magnetic tunnel junction 25 may be composed of a dielectric material that is selected from the group consisting of aluminum oxide ($Al_2O_3$), magnesium oxide (MgO), boron nitride (BN), silicon oxide ($SiO_2$) and combinations thereof. The thickness of the insulating layer 27 may range from 1 nm to 20 nm. In another embodiment, the thickness of the insulating layer 27 may range from 1 nm to 10 nm.

The second ferromagnetic plate 28 that is present on the surface of the insulating layer 27 that is opposite the surface of the insulating layer 27 that is in contact with the first ferromagnetic plate 26 may be referred to as the reference layer of the magnetic tunnel junction 25. The second ferromagnetic plate 28 may be one or more of nickel iron (NiFe), cobalt iron (CoFe), iridium-manganese (IrMn), platinum manganese (PtMn), ruthenium (Ru), cobalt iron boron (CoFeB), chromium molybdenum (CrMo), tantalum (Ta), tantalum nitride (TaN), and combinations thereof. The second ferromagnetic plate 28 may be composed of a single layer or multiple layers. It is noted that the above noted materials for the second ferromagnetic plate 28 are selected for illustrative purposes only and are not intended to be limiting. Other ferromagnetic materials are also suitable for the second ferromagnetic plate 28. The thickness for the second ferromagnetic plate 28 may range from 1 nm to 20 nm. In another embodiment, the thickness of the second ferromagnetic plate 28 may range from 1 nm to 10 nm.

The electrically conductive mask 20 that is present on the second ferromagnetic plate 28 of the magnetic tunnel junction 25 may be composed of any electrically conductive material. Typically, the composition of the electrically conductive mask 20 is selected so that it may function as an etch mask for patterning the material layers that provide the magnetic tunnel junction 25, while being electrically conductive so that the structure may remain following patterning of the magnetic tunnel junction so that the electrically conductive mask 20 provides an electrical contact to the magnetic tunnel junction 25. The electrically conductive mask 20 may be composed of a single layer or may be a multi-layered structure. In some embodiments, the electrically conductive mask 20 is composed of a transition metal. In some embodiments, the electrically conductive mask 20 may be composed of a metal nitride. For example, the electrically conductive mask 20 may be composed of copper (Cu), titanium (Ti), titanium nitride (TiN), tantalum (Ta), tantalum nitride (TaN), aluminum (Al), tungsten (W) and combinations thereof. In some embodiments, the electrically conductive mask 20 may also be composed of a semiconductor material, such as doped polysilicon. In some embodiments, the electrically conductive mask 20 may have a thickness ranging from 10 nm to 100 nm. In other embodiments, the electrically conductive mask 20 can range from 40 nm to 60 nm.

The layered structure of the electrically conductive mask 20 and the magnetic tunnel junction 25 may be formed by blanket depositing material layers for the first ferromagnetic layer 26, the dielectric layer 27, the second ferromagnetic layer 28 of the magnetic tunnel junction 25, as well as the material layer for the electrically conductive mask 20, to provide a layered stack. The metallic containing layers of the magnetic tunnel junction 25, such as the first and second ferromagnetic layers 26, 28, and the electrically conductive mask 20 may be formed using a physical vapor deposition method, such as plating, sputtering, electroplating, electrophoretic deposition, and combinations thereof. The dielectric layer 27 of the magnetic tunnel junction 25 may be formed using a chemical vapor deposition (CVD)) process, such as plasmas enhanced chemical vapor deposition (PECVD), metal organic chemical vapor deposition (MOCVD), high density plasma chemical vapor deposition (HDPCVD), atomic layer deposition (ALD) and combinations thereof.

Following the formation of the layered stack, the material layers of the layered stack may be patterned and etched so that the remaining portions of the layered stack provides the electrically conductive mask 20 and the magnetic tunnel junction 25. Specifically, a pattern is produced by applying a photoresist to the surface to be etched, exposing the photoresist to a pattern of radiation, and then developing the pattern into the photoresist utilizing a resist developer. Once the patterning of the photoresist is completed, the sections covered by the photoresist are protected, while the exposed regions are removed using a selective etching process that removes the unprotected regions. In one embodiment, the electrically conductive mask 20 is first patterned and etched using a photoresist mask; the photoresist mask is removed; and the material layers for the second ferromagnetic layer 28, the dielectric layer 27, and the first ferromagnetic layer 26 are etched using the electrically conductive mask 20 to define the magnetic tunnel junction 20.

The etch process for removing exposed portions of the material layers for the electrically conductive mask 20, the second ferromagnetic layer 28, the dielectric layer 27 and the first ferromagnetic layer 26 may be an anisotropic etch process, such as reactive ion etch (RIE). Typically, the etch process that is used to define the magnetic tunnel junction 25 is selective to the first electrode 10 and the substrate 5.

The layered structure of the electrically conductive mask 20 and the magnetic tunnel junction 25 typically has a height H1 ranging from 50 nm to 200 nm. In another embodiment, the layered structure of the electrically conductive mask 20 may have a height H1 ranging from 50 nm to 100 nm. In one embodiment, the width W1 of the layered structure of the electrically conductive mask 20 and the magnetic tunnel junction 25 may range from 10 nm to 200 nm. In another embodiment, the width W1 of the layered structure of the electrically conductive mask 20 and the magnetic tunnel junction 25 may range from 10 nm to 100 nm. In some embodiments, the layered structure is centrally positioned on the first electrode 10 so that a portion of the first electrode 10 is exposed on opposing sides of the layered structure.

Figure 3:
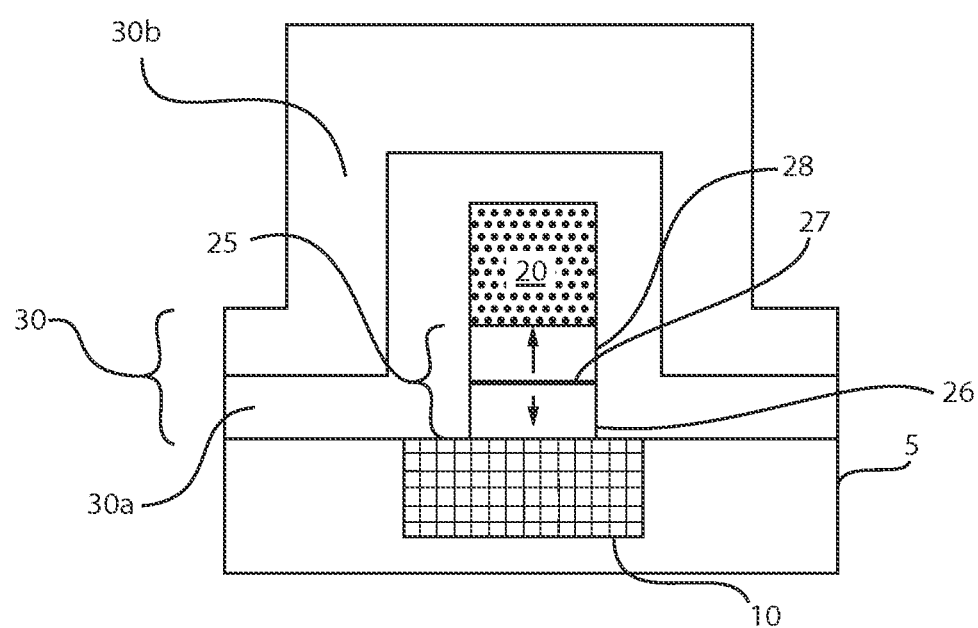
FIG. 3 is a side cross-sectional view depicting forming at least one dielectric layer to encapsulate the layered stack of a magnetic tunnel junction and the electrically conductive mask, in accordance with one embodiment of the present disclosure.

FIG. 3 depicts forming at least one dielectric layer 30 to encapsulate the layered structure of a magnetic tunnel junction 25 and the electrically conductive mask 20. By encapsulate it is meant that the at least one dielectric layer 30 is formed on the upper surface of the layered structure of the electrically conductive mask 20 and the magnetic tunnel junction 25, as well as the sidewall surfaces of the layered structure of the magnetic tunnel junction 25 and the electrically conductive mask 20. The at least one dielectric 30 is also positioned on the exposed upper surface of the first electrode 10 and the substrate 5.

The at least one dielectric layer 30 may be composed of any dielectric material. For example, the at least one dielectric layer 30 may be composed of an oxide, nitride or oxynitride material. In the embodiment that is depicted in FIG. 3, the at least one dielectric layer 30 is composed of a first dielectric layer 30a and a second dielectric layer 30b. The first dielectric layer 30a is formed directly on the layered structure of the electrically conductive mask 20 and the magnetic tunnel junction 25, as well as being formed directly on exposed portions of the first electrode 10 and the substrate 5. The first dielectric layer 30a may be composed of a nitride, such as silicon nitride, but other dielectric compositions are suitable for use as the first dielectric layer 30a, such as oxides and oxynitride materials. The first dielectric layer 30a may be deposited using a conformal deposition process. The term "conformal" denotes a layer having a thickness that does not deviate from greater than or less than 30% of an average value for the thickness of the layer. Examples of conformal deposition processes for forming the first dielectric layer include plasma enhanced chemical vapor deposition (PECVD), metal organic chemical vapor deposition (MOCVD), atomic layer deposition (ALD) or combinations thereof. The thickness of the first dielectric layer 30a may range from 50 nm to 200 nm. In another embodiment, the thickness of the first dielectric layer 30a may range from 50 nm to 100 nm.

The second dielectric layer 30b may be formed atop the first dielectric layer 30a, and may be an interlevel dielectric material. Examples of interlevel dielectric materials that are suitable for the second dielectric layer 30b may include $SiO_2$, $Si_3N_4$, SiC, SiCO, SiCOH, and SiCH compounds, the above-mentioned silicon containing materials with some or all of the Si replaced by Ge, carbon doped oxides, inorganic oxides, inorganic polymers, hybrid polymers, organic polymers such as polyamides or SiLK™, other carbon containing materials, organo-inorganic materials such as spin-on glasses and silsesquioxane-based materials, and diamond-like carbon (DLC), also known as amorphous hydrogenated carbon, $\alpha$-C:H). In some embodiments, a semiconductor material may be used for the substrate 5 instead of a dielectric material, or the substrate 5 may include a combination of semiconductor and dielectric materials. The second dielectric layer 30b may be deposited using chemical vapor deposition (CVD) methods, such as plasma enhanced chemical vapor deposition (PECVD), spin on deposition, chemical solution deposition and combinations thereof. The second dielectric layer 30b may have a thickness ranging from 50 nm to 200 nm. In another embodiment, the second dielectric layer 30b may have a thickness ranging from 50 nm to 100 nm.

Figure 4:
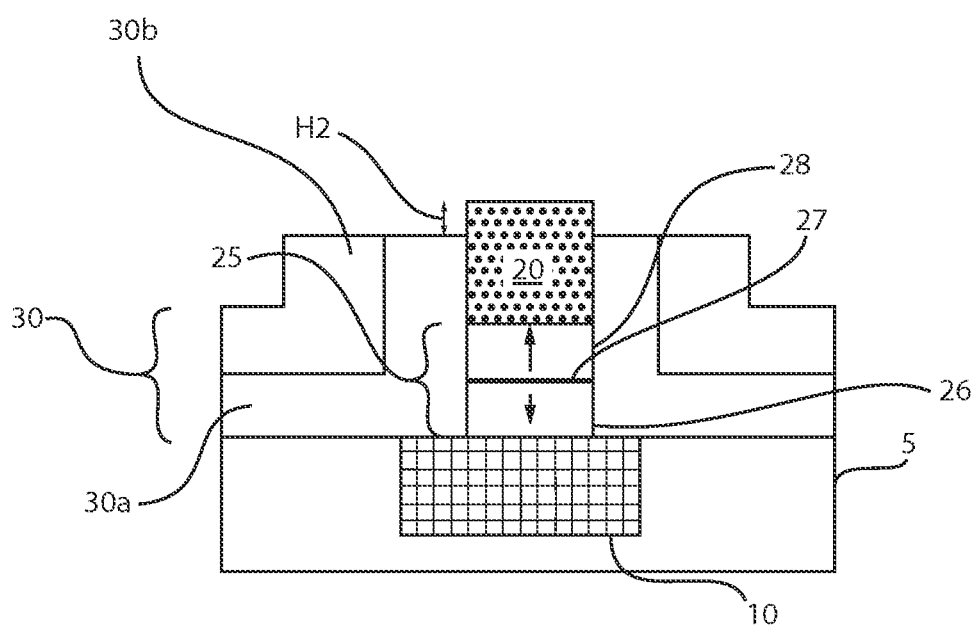
FIG. 4 is a side cross-sectional view depicting ion beam etching to remove the portion of the at least one dielectric layer that is present on the electrically conductive mask, wherein a remaining portion of the at least one dielectric layer is present over the first electrode, in accordance with one embodiment of the present disclosure.

FIG. 4 depicts ion beam etching to remove the portion of the at least one dielectric layer 30 that is present on the electrically conductive mask 20, wherein a remaining portion of the at least one dielectric layer 30 is present over the first electrode 10. Ion beam etching/ion beam milling employs sub-micron ion particles that are accelerated and bombard the surface of the target work. Ion Beam Etching employs only noble inert gases, such as Ar, Xe, Ne or Kr, which enables physical etching or sputtering, which is distinguished from chemical etching, such as the chemical etching provided by reactive ion etch. Typically, during ion beam etching/ion beam milling the work piece is mounted on a rotating table inside a vacuum chamber. Milling ions, e.g., argon ions, contained within plasma formed by an electrical discharge are accelerated by a pair of optically aligned grids. The highly collimated beam is focused on a tilted work plate that rotates during the milling operation.

As with other etching process, a selectively applied protectant, such as a photo sensitive resist (photoresist), may be applied to the work element, e.g., at least one dielectric layer 30 of the layered structure of the electrically conductive mask 20 and the magnetic tunnel junction 25, prior to its introduction into the ion miller. The resist protects the underlying material, e.g., portion of the at least one dielectric layer 30 that is present on the first electrode 10, the sidewall of the magnetic tunneling junction (MTJ) 25, and the substrate 5, during the ion beam etching/ion beam milling process that removes the portion of the at least one dielectric layer 30 that is present on the upper surface of the electrically conductive mask 20. Everything that is exposed to the collimated ion beam etches during the process cycle, even the photoresist.

In some embodiments, the milling ions, such as argon (Ar) ions, strike the target materials while they are rotated within the vacuum chamber. This ensures uniform removal of waste material. This precision and its attendant repeatability is one strength of the collimated ion beam milling process. Other methods of etching, such as the chemical process, e.g., reactive ion etch, or laser etching simply do not deliver the same level of precision that an ion beam etch can.

The precision of the ion beam etching/ion beam milling process for removing the portion of the at least one dielectric layer 30 is at a level that allows for the portion of the at least one dielectric layer 30 to be recessed on the sidewalls of the electrically conductive mask 20 so that the upper surface of the electrically conductive mask 20 extends above the upper surface of the recessed upper surface of the at least one dielectric layer 30. In some embodiments, the entire sidewall of the magnetic tunnel junction 25 is covered by the etched at least on dielectric layer 30. End point detection (EPD) methods, such as second ion mass spectrometry or SIMS, may be employed in combination with ion beam milling/ion beam etching in order to determine the duration of the ion beam milling/ion beam etching process.

In some embodiments, following the ion beam etching/ion beam milling process, the upper surface of the electrically conductive mask 20 may extend above the upper surface of the at least one dielectric layer 30 that is etched by a dimension ranging from 1 nm to 50 nm. In another embodiment, the upper surface of the electrically conductive mask 20 may extend above the upper surface of the at least one dielectric layer 30 that is etched by a dimension ranging from 1 nm to 10 nm. In yet another embodiment, the upper surface of the electrically conductive mask 20 may extend above the upper surface of the at least one dielectric layer 30 that is etched by a dimension ranging from 10 nm to 50 nm.

In some embodiments, the apparatus for depositing the at least one dielectric layer 30, e.g., PECVD or ALD apparatus, and the ion beam milling/ion beam etching process may be clustered into a single tool.

Figure 5:
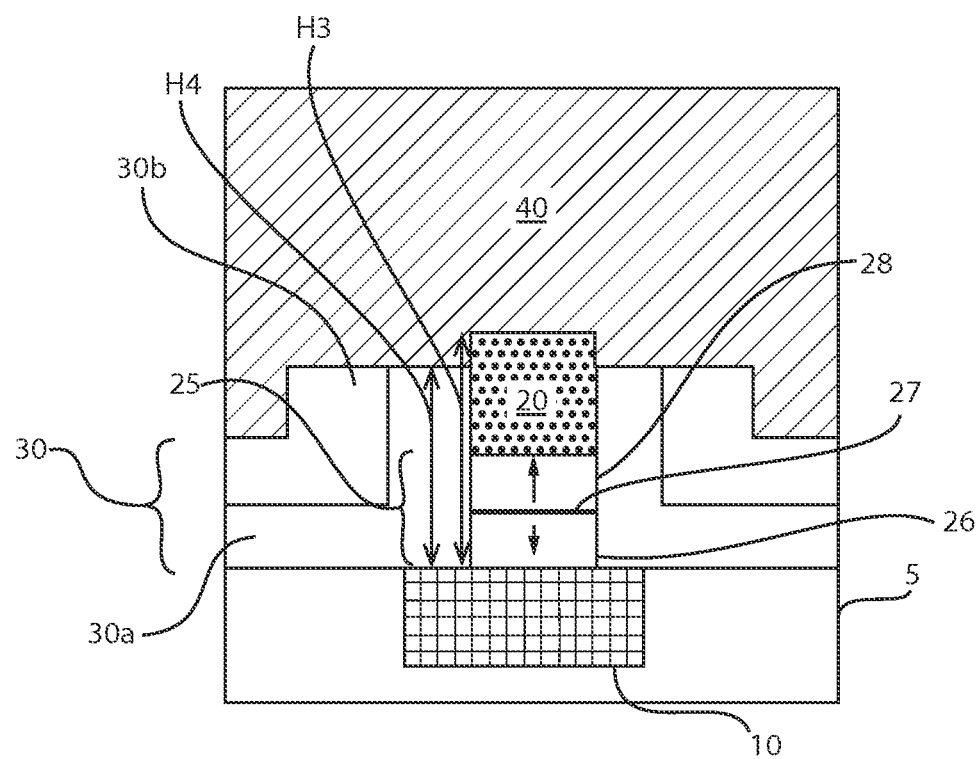
FIG. 5 is a side cross-sectional view depicting forming a second electrode in contact with the electrically conductive mask, in accordance with one embodiment of the present disclosure.

FIG. 5 depicts one embodiment of forming a second electrode 40 on the exposed upper surface of the electrically conductive mask 20. The second electrode 40 is typically composed of an electrically conductive material, such as a metal. For example, the second electrode 40 may be composed of a metal material, such as copper, aluminum, tantalum, tungsten, titanium, platinum, silver, nickel or gold. In the embodiments, in which the second electrode 40 is composed of a metal, the second electrode 40 may be deposited using a physical vapor deposition (PVD) process. Examples of physical vapor deposition (PVD) processes that are suitable for forming the second electrode 40 include plating, sputtering, electroplating, electrophoretic deposition, and combinations thereof. In other embodiments, the metal may be deposited using a chemical vapor deposition process, such as plasma enhanced chemical vapor deposition (PECVD). In some embodiments, the material of the second electrode 40 may be an electrically conductive semiconductor, such as n-type doped polysilicon. The second electrode 40 may also be referred to as the top electrode to the magnetic tunnel junction 25. FIG. 5 depicts where the second electrode 40 is blanket deposited on an entirety of the upper surface, e.g., the electrically conductive mask 20 and the remaining portion of the at least one dielectric layer 30. Embodiments have been contemplated in which the material layer deposited for the second electrode 40 is patterned and etched after deposition.

Figure 6:
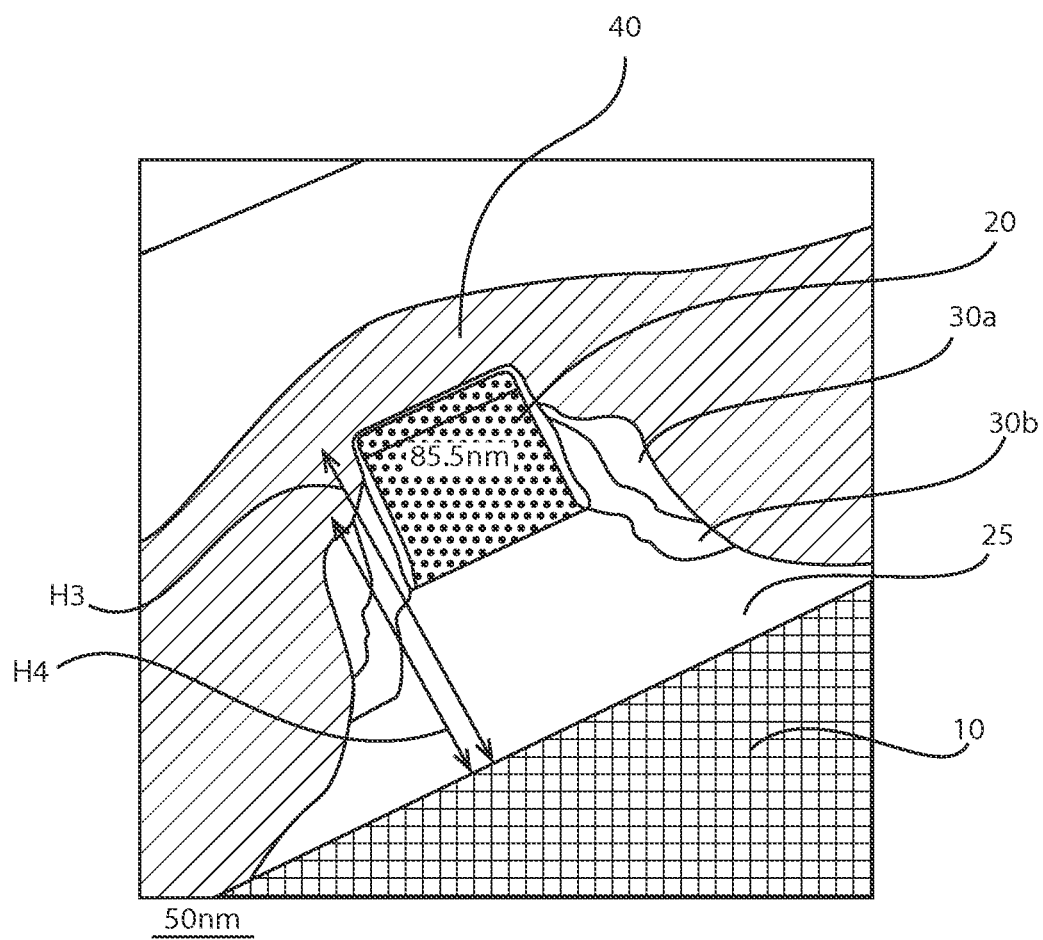
FIG. 6 is a side cross-sectional view of a memory device, in accordance with one embodiment of the present disclosure.

FIGS. 5 and 6 depict one embodiment of a memory device 100 is provided that includes a first electrode 10 present on a substrate 5, and a magnetic tunnel junction stack 25 present on the first electrode 10. An electrically conductive mask 20 is present on an upper surface of the magnetic tunnel junction 25. At least one dielectric layer 30a, 30b is present on exposed portions of the substrate 5 and the first electrode 10 that are present adjacent to the magnetic tunnel junction 25, a sidewall of the magnetic tunnel junction 25, and at least a portion of a sidewall of the electrically conductive mask 20. In some embodiments, the dimension H3 extending from an upper surface of the electrically conductive mask 20 to the first electrode 10 is greater than a height H4 of the at least one dielectric layer 30a, 30b that is present on said portion of the sidewall of the electrically conductive mask 20. A second electrode 40 is present on the electrically conductive mask 20.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

While the methods and structures of the present disclosure have been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A method of forming a memory device, the method comprising:

forming a magnetic tunnel junction on a first electrode using an electrically conductive mask and subtractive etch method, the first electrode formed within a trench of a substrate;

forming at least one dielectric layer to encapsulate the magnetic tunnel junction;

forming a photoresist etch mask exposing a portion of the at least one dielectric layer that is present on the electrically conductive mask;

removing said portion of the at least one dielectric layer that is present on the electrically conductive mask by ion beam etching and end point detection by second ion mass spectrometry (SIMS) to form a top contact for the magnetic tunnel junction, wherein a portion of the electrically conductive mask having a height of 10 nm or less is exposed and extends above a recessed surface of the at least one dielectric layer, said ion beam etching comprising a collimated beam of argon focused onto the photoresist etch mask and said portion of the dielectric layer while the portion of the at least one dielectric layer and the photoresist mask being milled by the collimated beam is rotated simultaneously uniformly removing said photoresist etch mask and said portion of the dielectric layer exposed by the photoresist etch mask, a duration of the ion beam etching to provide exposed height of the electrically conductive mask determined using said end point detection by said second ion mass spectrometry (SIMS); and forming a second electrode in contact with the electrically conductive mask.

2. The method of claim 1, wherein a remaining portion of the at least one dielectric layer is present over the first electrode.

3. The method of claim 2, wherein the remaining portion of the at least one dielectric layer is that present is over the first electrode extends to be in contact with a sidewall portion of the electrically conductive mask.

4. The method of claim 1, wherein the magnetic tunnel junction comprises a first ferromagnetic plate that is present on the first electrode, a dielectric layer that is present on the first ferromagnetic plate, and a second ferromagnetic plate that is present on the dielectric layer.

5. The method of claim 4, wherein the forming of the magnetic tunnel junction on the first electrode using the electrically conductive mask comprises:

depositing material layers for the first ferromagnetic plate, the dielectric layer, the second ferromagnetic plate and the electrically conductive mask;

forming a photoresist mask over a portion of the material layer for the electrically conductive mask that is present over the first electrode;

etching the material layer for the electrically conductive mask with an anisotropic etch that is selective to the photoresist mask; and etching the material layer for the first ferromagnetic plate, the dielectric layer, and the second ferromagnetic plate with an anisotropic etch using the electrically conductive mask as an etch mask.

6. The method of claim 1, wherein said forming the at least one dielectric layer to encapsulate the magnetic tunnel junction stack comprises depositing the at least one dielectric layer on an upper surface of the electrically conductive mask, a sidewall surface of the electrically conductive mask, a sidewall surface of the magnetic tunnel junction, a surface of the first electrode adjacent to the magnetic tunnel junction, and a surface of the substrate.

7. The method of claim 6, wherein said forming of the at least one dielectric layer comprises plasma enhanced chemical vapor deposition (PECVD), atomic layer deposition (ALD) or a combination thereof.

* * * * *